(12) United States Patent
Johnson et al.

(10) Patent No.: US 6,888,341 B2
(45) Date of Patent: May 3, 2005

(54) DUAL VOLTAGE CIRCUIT TESTER

(75) Inventors: Robert D. Johnson, Pleasant Prairie, WI (US); Mark R. Schaefer, Greendale, WI (US); Daniel Mieczkowski, Pleasant Prairie, WI (US)

(73) Assignee: Snap-On Incorporated, Pleasant Prairie, WI (US)

( * ) Notice: Subject to any disclaimer, the term of this patent is extended or adjusted under 35 U.S.C. 154(b) by 0 days.

(21) Appl. No.: 10/662,523

(22) Filed: Sep. 16, 2003

(65) Prior Publication Data

US 2005/0057243 A1 Mar. 17, 2005

(51) Int. Cl.[7] .............................................. G01R 19/14
(52) U.S. Cl. ..................... 324/72.5; 324/133; 324/324; 324/556
(58) Field of Search ................................ 324/72.5, 133, 324/556, 537, 414, 74, 761, 158.1, 754

(56) References Cited

U.S. PATENT DOCUMENTS 4,527,118 A * 7/1985 Koslar ........................ 324/133
5,789,911 A * 8/1998 Brass ......................... 324/72.5
6,433,530 B1 * 8/2002 Pool .......................... 324/72.5
6,512,361 B1   1/2003 Becker

* cited by examiner

Primary Examiner—David Zarneke
Assistant Examiner—Jimmy Nguyen
(74) Attorney, Agent, or Firm—McDermott Will & Emery LLP

(57) ABSTRACT

A handheld dual voltage circuit tester, method and electronic circuit that quickly allows a technician to determine whether an automotive electrical system runs on a 12–14 volt circuit or 36–42 volt circuit. The tester may be used for automobiles having a single voltage electrical system, or automobiles with distinct electrical systems operating on one of a 12–14 volts circuit or a 36–42 volt circuit. The tester includes a screwdriver-type elongated handle and probe tip. The tester also includes electronic circuitry disposed within its handle, heat shrink tubing, a conductive spring assembly, a strain relief, a retractable coil cord, a ground clip and insulation that encloses the ground clip. The tester also includes electronic circuitry that emits light of a first color when a 12–14 volt circuit is sensed, and light of a second color when a 36–42 volt circuit is sensed.

21 Claims, 3 Drawing Sheets

DUAL VOLTAGE CIRCUIT TESTER

FIELD OF THE DISCLOSURE

The present disclosure relates to voltage testers, and more particularly to efficiently determining whether an automotive electrical system operates at 12–14 volts or 36–42 volts.

BACKGROUND OF THE DISCLOSURE

Electrical circuit testers are well known in the art, and are commonly used by electricians as well as laypersons. Such testers are also used by automotive technicians to determine the voltage at which an automotive electrical system operates. Until recent years, automotive electrical systems typically incorporated a power supply of 6–12 volts, generally through a battery. Accordingly, a 6–12 volt circuit tester was used to determine the voltage level of power supplied to these systems. This type of circuit tester had a screwdriver-type design and included a light bulb. The tester was designed so that the light bulb would become brighter as the sensed voltage increased.

Today, a demand has emerged for a higher number and sophistication of electrical vehicular features. Types of vehicular features which may require greater power are electrically heated seats, entertainment systems, navigation systems, heated windshields, preheated catalytic converters, brake-by-wire systems, electronically-controlled valves and air conditioning systems, just to name a few. Because the greater number and sophistication of features generally require a greater amount of power, a higher demand has accordingly emerged for vehicles with a larger electrical power supply.

Because this higher level of power could be supplied with increased voltage, e.g., 36–42 volts, automotive manufacturers began to consider how they could implement automotive electrical systems that supported this higher power supply. Implementation of greater power supplies has been proposed generally through one of two means. Some automobile manufacturers, such as BMW (also known as Bavarian Motor Works), have proceeded to implement a higher voltage power supply system of 36 volts. The entire electrical system of such automobiles operates at 36 volts to 42 volts or higher. However, implementation of this higher 36–42 volt system requires that all electrical components used within the system support the higher voltage.

These higher voltage systems can be expensive and relatively complex when compared to the traditional 12–14 volt systems. Greater power supplies were generally more expensive, and the manufacturer would be required to pass this cost on to the consumer. By substantially increasing the prices of its vehicles, a manufacturer risked losing customers.

Moreover, the complexity of such systems required a re-design of automotive electrical systems so that they could support these higher voltages. Delaying the introduction of a higher voltage electrical system to wait for a re-design meant delaying the introduction of a greater number and sophistication of features. The manufacturer risked losing customers because the customer demanded such features. Accordingly, in lieu of full implementation of the higher voltage systems, some automobile manufacturers have proposed a more gradual transition. This more gradual approach has been in the form of a dual voltage system that operates in both the lower 12–14 volt range as well as the 36–42 volt range.

Implementation of dual voltage systems allows the automobile manufacturers flexibility in that they need not delay the introduction of features requiring a higher power supply until such time as the electrical components or re-designs are available that support these higher power supplies. Typically, dual voltage systems require two battery systems which power different subsystems of the electrical system. Due to these dual voltage systems, an automotive technician must determine which portions of the electrical system operate in the 12–14 volt range, and which portions operate within the higher 36–42 volt range.

Determination of the appropriate voltage level is often essential to proper repair of a vehicle. Because of these dual 12–14/36–42 voltage systems, it is desirable to have a circuit tester that can inform the technician as to which voltage level an automotive electrical system operates. Moreover, because all components of a particular automobile's electrical system might operate at either a higher voltage of 36–42 volts or a lower voltage of 12–14 volts, it is desirable to know the voltage level on which the system operates.

There is a need for an automotive circuit tester and method that provide an efficient way to determine an automobile's power supply voltage, and addresses the issues associated with the emergence of higher power supply systems.

SUMMARY OF THE DISCLOSURE

The present disclosure addresses the needs noted above by providing an efficient way of determining the voltage at which an automotive electrical system operates.

In one aspect of the present disclosure, a circuit tester is provided for testing automotive electrical systems. The circuit tester includes a curved handle portion that can be easily gripped by a technician, a screwdriver-type probe tip designed to contact the hot or positive side of an automotive circuit, and a ground clip designed to contact the negative side of an automotive circuit. The handle portion and the probe tip are substantially similar in size, shape and form to a regular heavy-duty screwdriver, that is visible to the technician while testing a test circuit. This is because the handle portion is composed of a material that is sufficiently transparent such that light from the LEDs may be viewed through the material.

The tester further includes electrical circuitry that is operatively coupled to the probe tip. This circuitry is configured to sense a low automotive system voltage of about 12–14 volts, as well as a high automotive system voltage of 36–42 volts. These voltages are measured according to the voltage drop between the probe tip and the ground clip, with ground being the reference point from which the voltage drop is measured. The circuit provides a visible display that informs the technician as to the voltage level of the automobile by emitting light of a first color when a low automotive system voltage is sensed, and light of a second color when a high automotive system voltage is sensed. The tester also includes safety features such as heat shrink tubing, a strain relief and an insulator boot. The heat shrink tubing or protective layer covers the probe tip and protects a portion of the probe tip from exposure. The strain relief protects the wiring within the tester from being damaged, thus reducing the risk of exposed wires and therefore, user injury. The insulator boot insulates the ground clip so that it, too, is not unnecessarily exposed. However, the insulator boot does not interfere with operation of the ground clip. The tester also includes a retractable coil cord for ease of stowing and a cap that protects the probe tip when the tester is not in use.

In another aspect of the present disclosure, a method is provided for testing the voltage of an automotive electrical system. The method is implemented using the tester hereinabove. The method includes connecting the probe tip to the positive side of an automotive circuit, connecting the ground clip to the negative side of an automotive circuit, and determining the voltage level of the automotive circuit based on the indicators on the visible display. The visible display emits light of a first color when a low automotive system voltage is sensed, and light of a second color when a high automotive system voltage is sensed.

In yet another aspect of the present disclosure, an electrical circuit is provided. The electrical circuit is relatively inexpensive, requiring few components. In this embodiment, the electrical components include a first voltage sensing device that senses a low automotive system voltage, and a second voltage sensing device that senses a high automotive system voltage.

The circuit further includes a first set of series-connected LEDs. When the first voltage sensing device turns on at about 10 volts, it energizes the first set of series-connected LEDs, thereby providing a visible indication to the technician of a 12–14 volt circuit. A second set of series-connected LEDs are responsive to the second voltage sensing device. When the second voltage sensing device turns on at about 34 volts, it energizes the second set of series connected LEDs, thereby providing a visible indication that a 36–42 volt is being sensed. These sensing devices are designed to sense voltages of 10 and 34 volts, which are lower than the 12–14 volt or 36–42 volts that would generally apply to an automotive electrical system. The relatively low voltage sensitivity of the sensing devices takes into account situations where a battery is low or a heavy load is applied to the electrical system. The circuit includes a number of resistors which impede the flow of current to the electronic circuit, especially the diodes, thus protecting against overdriving the diodes and burning them out.

One advantage of the present disclosure is to provide an easy-to-use, handheld circuit tester and method that assists a technician in quickly determining the voltage level at which an automotive electrical system operates.

Another advantage of the present disclosure is to provide a circuit tester that incorporates safety features due to the inherent risks associated with humans being in close proximity with live electrical wires.

BRIEF DESCRIPTION OF THE DRAWINGS

These and other objects, features, and characteristics of the present disclosure will become apparent to one skilled in the art from a close study of the following detailed description in conjunction with the accompanying drawings and appended claims, all of which form a part of this application. In the drawings:

DETAILED DESCRIPTION OF THE DISCLOSURE

The present disclosure relates to a tester, circuit and method for testing the voltage level of an automotive electrical circuit. The substantially screwdriver-shaped tester allows a technician to promptly determine whether the technician is testing a 12–14 volt circuit or a 36–42 volt circuit. This voltage level determination is made based on the color of light emitting diodes on the tester's visual display. A blue light emitting diode indicates a voltage of 12–14 volts is being sensed, while both red and blue light emitting diodes indicate a voltage level of 36–42 volts is being sensed. At times, the voltage drop of about 12–14 volts is hereinafter referred to as a low automotive system voltage, while the voltage drop of about 36–42 volts is hereinafter at times referred to as a high automotive system voltage. These voltage drops are measured with reference from the positive side of an automotive electrical circuit to the negative side of the same electrical circuit.

The voltage ranges of 12–14 volts and 36–42 volts take into account the difference between the power supplied to these electrical systems and the actual operating voltage of these electrical systems with reference to charging voltages. For example, when a 36 volt power supply is applied to an automotive electrical system, the actual operating voltage with respect to the charging voltage might be closer to 42 volts and sometimes higher.

The present disclosure is described with reference to testing voltage levels of automotive systems. The embodiments described herein may include or be used with any appropriate voltage source, such as a battery, an alternator and the like, providing any appropriate voltage. Although the embodiments described herein make particular reference to automobile systems which may include cars, trucks, SUVS, and other vehicles on wheels which incorporate 12–14 or 36–42 volt electrical systems, it should be understood that the systems may be incorporated into other devices, such as boats, ships, motorcycles, generators and airplanes. The embodiments of the tester, circuit and method described in the present disclosure are useful for applications that incorporate DC low voltage systems.

Figure 1:
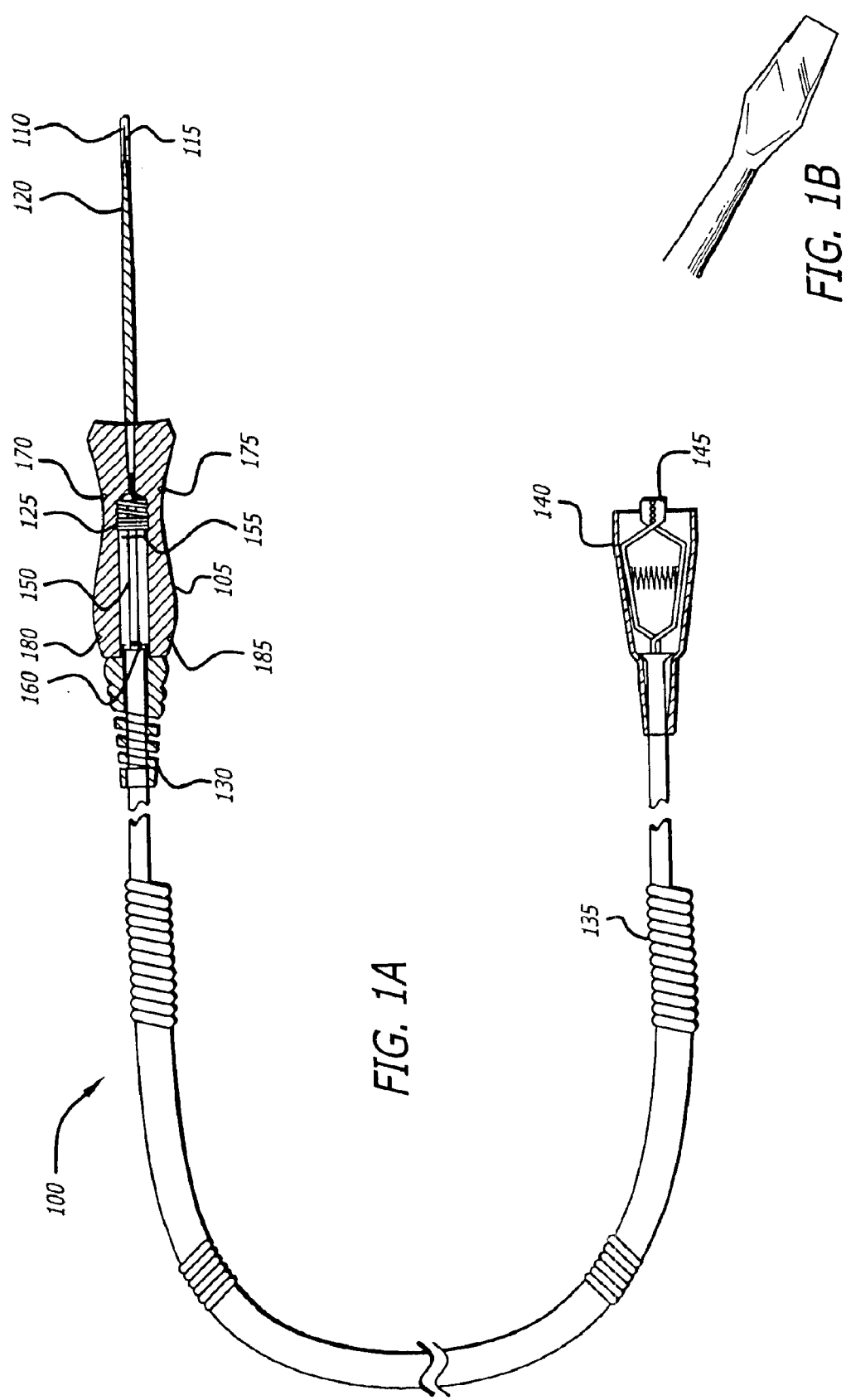
FIG. 1A is a top view of a dual voltage circuit tester in accordance with one embodiment of the present disclosure.
FIG. 1B is a perspective view of an alternative screwdriver-type probe tip in accordance with one embodiment of the present disclosure.

Referring now to FIG. 1A, illustrated is a top view of a handheld voltage tester 100 in accordance with one embodiment of the present disclosure. Because the tester 100 is handheld, its portability makes it particularly suitable as a circuit tester for an automotive circuit and circuits for vehicles generally. The tester includes a handle 105, cap 110, probe tip 115, heat shrink tubing 120, a spring assembly 125, strain relief 130, a retractable coil cord 135, an insulator boot 140, a ground clip 145 and a PCB subassembly 150.

The tester 100 of the present disclosure is easy to use. The handle 105 and probe tip 115 are substantially the shape and size of a heavy-duty screwdriver. The length L of handle 105 is indented and/or curved so that a technician may easily grip the handle 105 of the circuit tester 100 when testing an automotive circuit. The curved portion is substantially in the shape of an elongated "S". The end of the handle 105 nearest the heat shrink tubing 120 is wide so that the user's hand does not slip from the handle 105. The wide end of handle 105 also provides protection by stopping the user's hand from coming too close to the probe tip 115 where a live voltage might be measured. The circumference of handle 105 is furrowed or grooved for ease of gripping. The handle 105 is composed of a material that is sufficiently transparent so that LEDs on the PCB subassembly 150 are visible to the technician when the tester is in operation. Examples of materials of sufficient transparency include any polymer material available in transparent grades, such as polycarbonate, acrylic, nylon, cellulose acetate, cellulose butyrate, among others. The materials are listed in approximately increasing order of solvent resistance which is an important consideration for durability in products used in the automotive garage environment. As viewed through the polymer, the LEDs provide a visual indication or indications of the voltage level being tested as set forth in greater detail hereinbelow. Alternatively, or in addition to the transparent material, the handle may include openings 170, 175, 180, 185 through which LEDs may be viewed.

The probe tip 115 is made of a conductive material such as a steel alloy or other suitable material. The probe tip 115 is designed for connection with wires and contacts in an automotive electrical circuit. The probe tip 115 is similar in form, shape and size to a heavy duty screwdriver tip or shank. A screwdriver shank is generally used by a technician for insertion into a slot or recess located in the head of a screw. In the embodiment shown, the probe tip 115 is of a length similar to a screwdriver shank, and the end of probe tip 115 is pointed.

Alternatively, the screwdriver shank may be generally thin and wedge-shaped as shown in FIG. 1B. This screwdriver-type configuration is suitable for the tester 100 because it allows the wide side of probe tip 115 to be flatly placed against an automotive test circuit, thereby making the tester 100 easier to use and providing for better electrical flow from the automotive test circuit into the tester 100.

Alternatively, or in addition to the thin, wedge shape illustrated in FIG. 1B, screwdriver shanks are also commonly fluted with grooves or furrows such as with a Philips screwdriver. Accordingly, a fluted embodiment for the probe tip 115 would also make it suitable for contacting electrical wires since the wire to be tested may be positioned into the groove of such a fluted screwdriver-type probe tip.

The spring assembly 125 provides two functions. One advantage of the spring assembly 125 is that it acts as an electrical conductor. The spring assembly 125 may be made of a conductive material such as a steel alloy, copper, or any other suitable material. Another advantage of the spring assembly 125 is that it acts as a compression device. In this respect, the spring assembly 125 protects the electronic circuitry on the PCB subassembly 150 within the handle 105 by providing a barrier for force that might be relayed to the circuitry. Such force might be relayed, for example, when the probe tip 115 is placed into a test circuit.

The heat shrink tubing 120 is plastic tubing that has been heated and shrink-fitted over the probe tip 115. Heat shrink tubing 120 decreases the amount of conductive material of probe tip 115 that is exposed. Because of the potentially hazardous level of voltage that the probe tip 115 measures, heat shrink tubing 125 acts as a protective feature against conduction to objects other than the probe and its circuitry. In lieu of heat shrink tubing, any suitable protective layer may be positioned on the probe tip 115 to act as a protective feature.

Strain relief 130 is coaxial with handle 105 and retractable coil cord 135. Strain relief 130 extends from handle 105 and forms a substantially annular ring around retractable coil cord 135. Strain relief 130 protects the circuitry on the PCB subassembly 150 from experiencing undue stress, torsion and deformation, thus reducing the likelihood that the circuitry contained therein will be damaged. The circuitry could experience undue stress, torsion or deformation if, for example, the tester 100 was used with a technician handling the cord 135 as opposed to the handle 105. The force applied to the wiring of the cord 135 after prolonged use could cause the electrical wires inside cord 135 to be damaged. If the wires are damaged, the tester 100 could malfunction. Moreover, the wires could become exposed through the insulated covering of cord 135, thus increasing chances of user injury. The inside diameter of strain relief 130 is larger the outside diameter of retractable coil cord 135 so that it does not rub against or abrade cord 135.

Ground clip 145 is used as a connection to the ground of the circuit being tested. Ground is the reference point from which a voltage drop is measured. Ground clip 145 is encased and surrounded by insulator boot 140, which provides protection against the undesired flow of current from the test circuit from the tester 100 to the technician or other objects. Insulator boot 140 is made of any suitable material that is both heat resistant as well as electrically resistant. Ground clip 145 extends from the inside diameter insulator boot 140 a sufficient amount such that insulator boot 140 need not be removed from ground clip 145 in order for ground clip 145 to properly contact and ground the test circuit.

Retractable coil cord 135 is a flexible wire, the circumference of which is enclosed by insulation. Like insulator boot 140, the insulation may be of any suitable material. The retractable coil cord 135 permits the cord to be retracted, and therefore, stowed away easily when the tester 100 is not in use, and lengthened when the tester 100 is in use. The coil—and accordingly, the coil cord—should be sufficiently long such that the hot side of any portion of an automotive circuit can be reached with one end, and that the negative side of that circuit can be reached with the end of the tester 100 that supports the ground clip 145.

Wire 160 connects the wiring of the retractable coil cord 135 and the circuitry of the PCB subassembly 150. The retractable coil cord 135 extends from the circuitry to ground clip 145, thus extending to an electrical ground. This wire 160 is stripped and soldered to the PCB subassembly 150. Wire 155 connects the spring assembly 125 and the PCB subassembly 150. This wire 155 is soldered to the PCB subassembly 150.

The tester 100 obtains its power from the test circuit. Accordingly, no battery or other power supply is included with the tester 100. Nor is a power switch included.

The circuitry (not shown) for the tester 100 is mounted onto a printed circuit board (PCB) subassembly 150. A schematic for the circuitry on the PCB subassembly is illustrated and described in greater detail in connection with FIG. 3.

Figure 2:
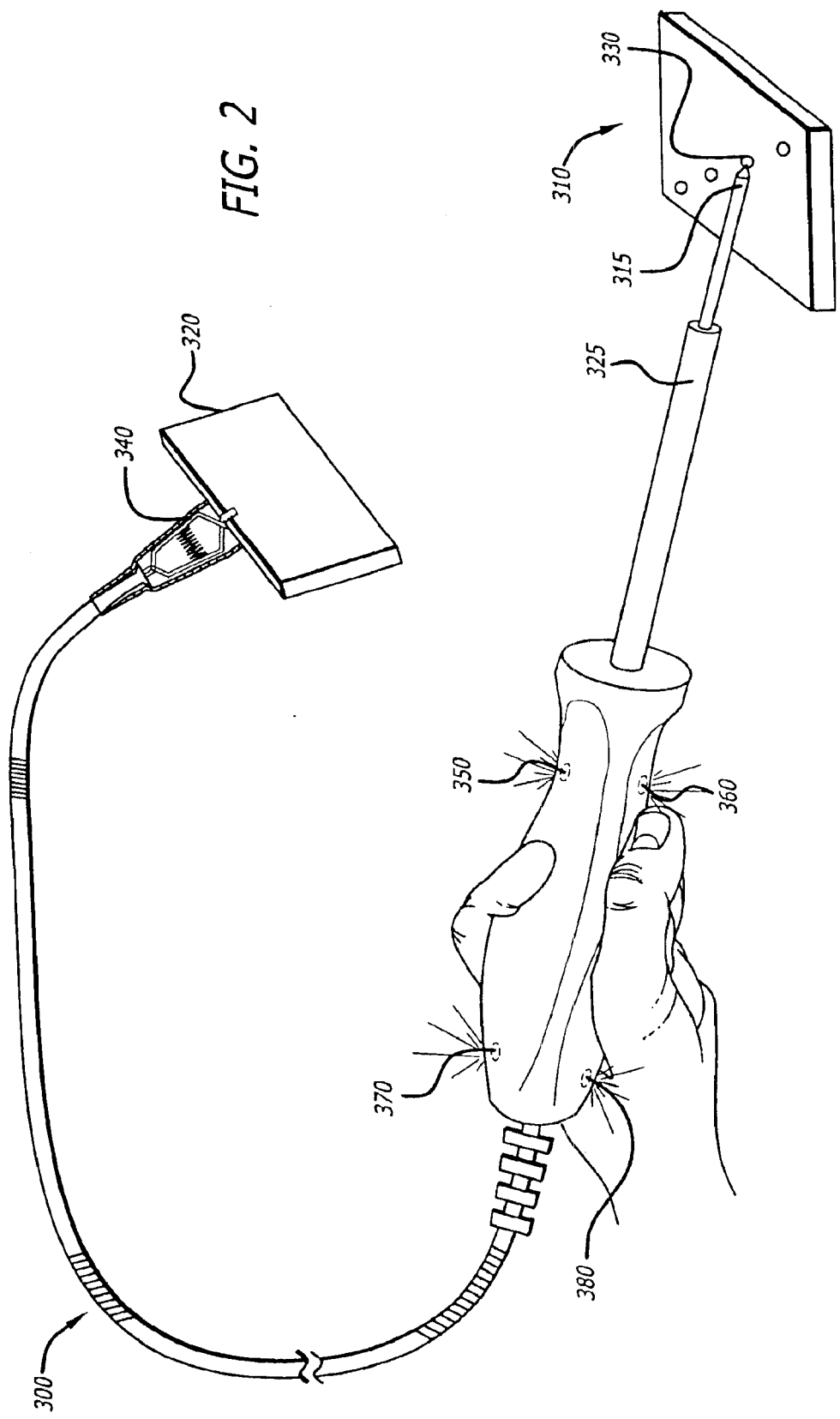
FIG. 2 is an illustration of the dual voltage circuit tester during a test of an automotive electrical circuit in accordance with one embodiment of the present disclosure.

Referring now to FIG. 2, illustrated is a perspective view of the dual voltage circuit tester 300 during a test of an automotive electrical circuit 310 in accordance with one embodiment of the present disclosure. Circuit 310 is tested by connecting the circuit tester 300 to the automotive electrical circuit 310 while observing proper polarity, which is known in the art. Generally, the probe tip 315 should contact the positive or "hot" side 330 of the wiring for an automotive circuit 310. Heat shrink tubing 325 decreases the amount of conductive material of probe tip 315 that is exposed. The automotive circuit may reside in a wiring harness, lighting system, starter, solenoid, brake light, electrical motor, power steering pump or any other electrical system resident in an automobile. The ground clip 340 should be connected to the circuit ground or negative side 320 of the same automotive circuit 310.

The tester 300 may be held by the technician in a manner similar to the way in which a pencil or fork is held. Visible indicator LEDs 350, 360 emit light of a first color in the visible spectrum when the circuitry on PCB subassembly 150 senses a low automotive system voltage, thereby providing a visible indication to the technician of a 12–14 volt circuit. The LEDs 350, 360 are located on two sides of handle 105 so that they can be viewed easily by the technician. LEDs 350, 360 are substantially simultaneously energized, so that they create an illusion of a single light when viewed by the technician.

Visible indicators 370, 380 emit light of a second color in the visible spectrum when the circuitry senses a high automotive system voltage, thereby providing a visible indication to the technician of a 36–42 volt circuit. The LEDs 370, 380 are located on two sides and at one end of handle 105 so that they can be viewed easily by the technician. LEDs 370, 380 are substantially simultaneously energized, so that they create an illusion of a single light when viewed by the technician.

Although LEDs 350, 360, 370, 380 are located on two sides and at both ends of the PCB subassembly 150 as viewed on handle 105 in this embodiment, it should be understood that the LEDs 350, 360, 370, 380 can be located at any point such that they may be viewed by the technician. Similarly, the number of LEDs is not limited to two. The tester 100 may include one or more LEDs or other visible indicators for each voltage level sensed. Moreover, the LEDs for low automotive voltages 350, 360 and the LEDs for high automotive system voltages 370, 380 need not be of a different color. The handle 105 could simply include markings that indicate which voltage level is being sensed.

Figure 3:
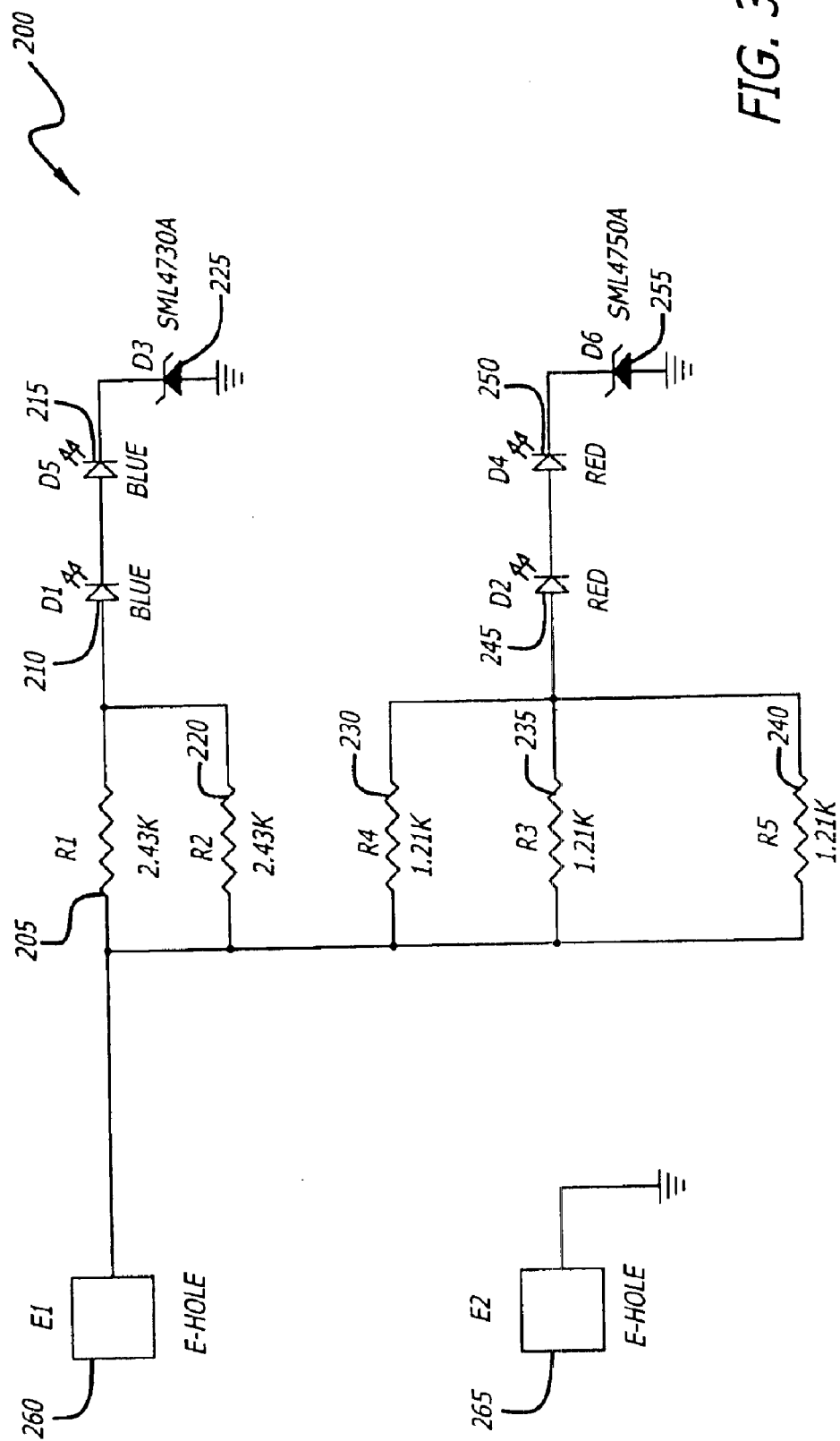
FIG. 3 is an electrical schematic for an electronic circuit for an automotive circuit tester in accordance with one embodiment of the present disclosure.

Referring now to FIG. 3, illustrated is an electrical schematic 200 of a circuit for a circuit tester in accordance with one embodiment of the present disclosure. The circuit 200 includes a first resistor 205 coupled in parallel to a second resistor 220. The resistance of resistors 205, 220 is 2.43 kilo-ohms. The resistors are designed in parallel to effect a total resistance between about 1.215 kilo-ohms. Light emitting diodes 210, 215 are connected in series with resistor 205 and resistor 220. These diodes 210, 215 emit light in the blue range when a breakdown voltage of 10 volts is reached. The 10 volts is, of course, lower than the 12–14 volts indicated as sensed by the circuit 200. The lower breakdown voltage of diode 225 compensates for situations when an automotive battery is low, a common situation in an automobile diagnosed with problems. Moreover, voltage will drop slightly when heavy loads are applied to the battery. A common example of a heavy load application is when an automotive starter is energized.

Moving now to the other end of the circuit 200, resistors 230, 235, 240 are each 1.21 kilo-ohms. Light emitting diodes 245, 250 emit light in the red spectrum when a breakdown voltage of 34 volts is sensed by the tester. The 34 volts is, of course, lower than the 36–42 indicated as sensed by the circuit 200. The lower breakdown voltage of diode 255 accounts for situations when an automotive battery is low, a common situation in an automobile diagnosed with problems. Moreover, voltage will drop slightly when heavy loads are applied to the battery. A common example of a heavy load occurrence is when an automotive starter is energized.

Wiring at connection 265 connects the wiring of the retractable coil cord and the circuitry of the PCB subassembly. The retractable coil cord extends from the circuitry to ground clip, thus extending to an electrical ground. Wiring at connection 265 is stripped and soldered to the PCB subassembly.

Connection 260 connects the spring assembly and the PCB subassembly. Wiring at connection 260 is soldered to the PCB subassembly. Because the conductive spring assembly also contacts the probe tip, current is conducted from the probe tip to the PCB subassembly via the conductive spring assembly.

When the tester senses a closed circuit of 12–14 volts, current flows through resistors 205, 220, light emitting diodes 210, 215 and zener diode 225. Zener diode 225, being a reverse biased semiconductor diode, is designed to experience a large, abrupt rise in electrical current in the presence of a small voltage. Because zener diode 225 has a breakdown voltage of about 10 volts (in reference from probe tip to ground), this diode 225 turns on when it reaches this breakdown voltage. If the voltage is lower than around 10 volts, zener diode 225 will not turn on. When the zener diode 225 turns on, light emitting diodes 210, 215 are energized, and they emit a blue light which indicates that the probe is detecting a 12–14 volt circuit.

When the tester's probe tip of the tester detects a voltage of 34 volts or more, current flows through essentially the entire circuit, including resistors 205, 220, 230, 235, 245 as well as light emitting diodes 210, 215, 245, 250 and zener diodes 225, 255. At this point, zener diode 255 turns on due to its breakdown voltage being reached at approximately 34 volts (in reference from probe tip to ground). When zener diode 255 turns on, light emitting diodes 245, 250 are energized, thereby emitting a red light which indicates that the probe is detecting a 36–42 volt circuit. Light emitting diodes 210, 215 are also energized due to zener diode 225 having reached its breakdown voltage. As disclosed hereinabove, light emitting diodes emit a blue light, thus indicating the sensing of at least the lower voltage level of 12–14 volts.

The voltage tester, circuit and method have been described with reference to certain exemplary embodiments. However, it will be readily apparent to those skilled in the art that it is possible to embody the tester circuit and method in forms other than these embodiments. This may be done with out departing from the spirit of the disclosure. The embodiments are merely illustrative and should not be considered restrictive in any way. The scope of the tester, circuit and methods are given by the appended claims, rather than the preceding description, and all variations and equivalents that fall within the range of the claims are intended to be embraced.

We claim:

1. A handheld circuit tester for an automotive electrical system having circuit portions respectively operable at a first nominal voltage range with respect to ground and a second nominal voltage range with respect to ground, the tester comprising:
   an elongated, curved handle portion, the handle portion being substantially in the shape of a screwdriver handle;
   a probe device, substantially in the shape of a screwdriver shank, the probe device coupled to the handle portion and is capable of contacting a circuit point of an automotive circuit;
   a ground device coupled to the handle portion and capable of being securely attached to a ground point; and
   circuitry disposed within the handle portion and operatively coupled to the probe device and the ground device, the circuitry being configured to sense voltage at the circuit point and to indicate whether the sensed voltage corresponds to the first or second nominal voltage range.

2. The tester as recited in claim 1, wherein the circuitry includes a first visible indicator that corresponds to a sensed voltage within the first nominal voltage range, and a second visible indicator that corresponds to a sensed voltage within the second nominal voltage range.

3. The tester as recited in claim 2, wherein the first and second visible indicators are light emitting devices.

4. The tester as recited in claim 3, wherein the handle portion is composed of a material that is sufficiently transparent such that the light emitting devices are visible through the material when the light emitting devices are energized.

5. The tester as recited in claim 4, wherein the handle material is a polymer.

6. The tester as recited in claim 3, wherein the first visible indicator when active emits light of a first color, and the second visible indicator when active emits light of a second color.

7. The tester as recited in claim 3, wherein the first and second visible indicators each comprise two LEDs.

8. The tester as recited in claim 2, wherein the circuitry comprises:
   a first zener diode having a breakdown voltage sufficient to energize only the first visible indicator when a voltage corresponding to the lower nominal voltage range is sensed; and
   a second zener diode having a breakdown voltage sufficient to energize the second visible indicator when a voltage corresponding to the higher nominal voltage range is sensed.

9. The tester as recited in claim 1, further comprising:
   a spring assembly disposed within the handle between the probe device and electronic circuit, wherein the spring assembly is comprised of a conductive material, and wherein the spring assembly is configured to compress when force is applied to the probe device.

10. The tester as recited in claim 9, further comprising:
    a retractable assembly that includes an insulated flexible electrical wire, the retractable assembly being disposed between the spring assembly and the ground device.

11. The tester as recited in claim 10 further comprising:
    a protective cap having an open end capable of securely fitting over at least a portion of the probe device, whereby the protective cap protects the probe device from physical damage when the probe device is not in use; and
    a strain relief device extending from the handle, the strain relief device being coaxial with the handle and the retractable assembly, wherein the retractable assembly has an outside diameter and the strain relief device has an inside diameter, wherein inside diameter of the strain relief device forms a substantially annular ring around at least a portion of the outside diameter of the retractable assembly.

12. The tester as recited in claim 1, wherein the ground device includes insulation positioned thereon, and
    wherein the probe device includes protective layer tubing positioned thereon, the tubing being configured to securely fit over an exposed portion of the probe device.

13. A method for testing the voltage level of an automotive circuit with a circuit tester, the automotive circuit having portions respectively operable at a first nominal voltage level with respect to ground and a second nominal voltage level with respect to ground, the circuit tester including an elongated curved handle portion, a probe device substantially in the shape of a screwdriver shank, a ground device, and electronic circuitry operatively coupled to the probe device and the ground device, the electronic circuitry being disposed within the handle portion, wherein the circuitry is configured to sense a voltage at a circuit point of an automotive circuit, and wherein the circuit tester further includes a visible display operatively coupled to electronic circuitry, the handle being composed of a material that is sufficiently transparent such that the visible display is visible through the handle, the method comprising the steps of:
    connecting the probe device to a circuit point of an automotive circuit;
    connecting the ground device to ground; and
    determining whether the voltage at the circuit point corresponds to the first or second nominal voltage level based on the visible display.

14. The method as recited in claim 13, wherein the visible display includes a first visible indicator that corresponds to a sensed voltage at the first nominal voltage level, and a second visible indicator that corresponds to a sensed voltage at the second nominal voltage level.

15. The method as recited in claim 14, wherein the first visible indicator includes an LED that emits light of a first color when active, and the second visible indicator includes an LED that emits light of a second color when active.

16. An electrical circuit for testing the voltage level of an automotive circuit, the electrical circuit being adapted to be disposed within a curved, elongated handle of a circuit tester for automotive electrical circuits, the handle being composed of a material that is sufficiently transparent such that light from a first light emitting load and light from a second light emitting load are visible through the handle, the circuit comprising:
    a first voltage sensing device that senses a nominal low level automotive system voltage with respect to ground;
    a second voltage sensing device that senses a nominal high level automotive system voltage with respect to ground;
    wherein the first light emitting load is responsive to the first voltage sensing device to be energized when the nominal low level automotive system voltage is sensed; and
    the second light emitting load is responsive to the second voltage sensing device to be energized when the nominal high level automotive system voltage is sensed.

17. The circuit as recited in claim 16, wherein the first light emitting load is a set of series-connected LEDs, and the second light emitting load is a set of series-connected LEDs.

18. The circuit as recited in claim 17, wherein the first set of series-connected LEDs emits light of a first color when energized and the second set of series-connected LEDs emits light of a second color when energized.

19. The circuit of claim 16 wherein the first voltage sensing device comprises a zener diode, and the second voltage sensing device comprises a zener diode.

20. An electrical circuit for testing the voltage level of an automotive circuit, the circuit comprising:
    a first zener diode configured to energize a first visible indicator;
    a second zener diode configured to energize a second visible indicator;
    wherein the first visible indicator is responsive to the first zener diode such that the first visible indicator provides a visible indication that a low automotive system voltage is sensed, and wherein the first zener diode has a breakdown voltage sufficient to energize only the first visible indicator when a low automotive system voltage is sensed; and wherein the second visible indicator is responsive to the second zener diode such that the second visible indicator provides a visible indication that a high automotive system voltage is sensed, and wherein the second zener diode has a breakdown voltage sufficient to energize the second visible indicator when a high automotive system voltage is sensed.

21. An apparatus for testing the voltage level of an automotive circuit having circuit portions respectively operable at a low nominal voltage range with respect to ground and a high nominal voltage range with respect to ground, the apparatus comprising:

means for sensing an automotive system voltage in the low nominal range;

means for providing a first visible indicator when a low automotive system voltage is sensed;

means for sensing an automotive system voltage in the high nominal range; and means for providing a second visible indicator when a high automotive system voltage is sensed.

* * * * *